US009338879B2

(12) United States Patent
Lee

(10) Patent No.: US 9,338,879 B2
(45) Date of Patent: May 10, 2016

(54) THROUGH-HOLE LAYOUT STRUCTURE INCLUDING FIRST AND SECOND PAIRS OF DIFFERENTIAL SIGNAL THROUGH-HOLES DISPOSED BETWEEN THREE GROUND THROUGH-HOLES

(71) Applicant: VIA Technologies, Inc., New Taipei (TW)

(72) Inventor: Sheng-Yuan Lee, New Taipei (TW)

(73) Assignee: VIA Technologies, Inc., New Taipei (TW)

( * ) Notice: Subject to any disclaimer, the term of this patent is extended or adjusted under 35 U.S.C. 154(b) by 0 days.

(21) Appl. No.: 14/534,170

(22) Filed: Nov. 6, 2014

(65) Prior Publication Data

US 2016/0021735 A1    Jan. 21, 2016

Related U.S. Application Data

(60) Provisional application No. 62/025,992, filed on Jul. 17, 2014.

(30) Foreign Application Priority Data

Sep. 15, 2014  (TW) .............................. 103131781 A

(51) Int. Cl.
*H05K 1/02*     (2006.01)
*H05K 1/11*     (2006.01)

(52) U.S. Cl.
CPC ............ *H05K 1/0216* (2013.01); *H05K 1/0245* (2013.01); *H05K 1/115* (2013.01); *H05K 2201/042* (2013.01); *H05K 2201/10189* (2013.01)

(58) Field of Classification Search
CPC ........................... H05K 1/0245; H05K 1/0216
USPC ...................................... 333/4, 5, 12
See application file for complete search history.

(56) References Cited

U.S. PATENT DOCUMENTS

| 4,891,616 A | * | 1/1990 | Renken | .................... | H01P 3/085 174/117 FF |
| 2006/0118329 A1 | * | 6/2006 | Nakamura | ........... | H05K 1/0222 174/260 |
| 2012/0325542 A1 | * | 12/2012 | Yokoyama | ........... | H05K 1/0251 174/262 |

* cited by examiner

*Primary Examiner* — Benny Lee
(74) *Attorney, Agent, or Firm* — Jianq Chyun IP Office

(57) ABSTRACT

A through-hole layout structure is suitable for a circuit board. The through-hole layout structure includes a pair of first differential through-holes, a pair of second differential through-holes, a first ground through-hole, a second ground through-hole, and a third ground through-hole, which are all arranged on a first line. The first ground through-hole is located between the pair of first differential through-holes and the pair of second differential through-holes. The pair of first differential through-holes is located between the first ground through-hole and the second ground through-hole. The pair of second differential through-holes is located between the first ground through-hole and the third ground through-hole.

21 Claims, 4 Drawing Sheets

THROUGH-HOLE LAYOUT STRUCTURE INCLUDING FIRST AND SECOND PAIRS OF DIFFERENTIAL SIGNAL THROUGH-HOLES DISPOSED BETWEEN THREE GROUND THROUGH-HOLES

CROSS-REFERENCE TO RELATED APPLICATION

This application claims the priority benefits of U.S. provisional application Ser. No. 62/025,992, filed on Jul. 17, 2014 and Taiwan application serial no. 103131781, filed on Sep. 15, 2014. The entirety of each of the above-mentioned patent applications is hereby incorporated by reference herein and made a part of this specification.

BACKGROUND OF THE INVENTION

1. Field of the Invention

The invention relates to a circuit board, and more particularly, to a through-hole layout structure suitable for a circuit board and used to reduce signal interference, and a circuit board and an electronic assembly adopting the through-hole layout structure.

2. Description of Related Art

The application of the current Universal Serial Bus 3.0 (USB 3.0) is widely used. However, issues of electromagnetic interference (EMI)/radio frequency interference (RFI) may occur at a frequency of about 2.5 GHz. The reason is, USB 3.0 has a data rate of 5 Gbps and the clock frequency thereof is 2.5 GHz. Therefore, an apparatus (such as the wireless module of a wireless mouse) at an operating frequency of about 2.5 GHz may fail due to interference from the signal on an USB 3.0.

For instance, the hub of USB 3.0 has a circuit board and a USB 3.0 chip and a USB 3.0 electrical connector installed on the circuit board. When a plastic material is adopted for the casing of the hub of the USB 3.0 and a suitable metal shield is absent, the RFI emitted by the USB 3.0 signal (clock frequency of 2.5 GHz) transmitted by the circuit board is about 2.5 GHz. Such EMI/RFI may affect the wireless module of a wireless mouse at an operating frequency of 2.4 GHz.

A method of differential signal is adopted for the architecture on an USB 3.0 for signal transmission. A differential transmission path needs to have good symmetry to ensure balance of the differential signal. When the differential transmission path is asymmetric, the differential signal may be converted to an undesired common mode noise, thereby causing the issue of RFI.

SUMMARY OF THE INVENTION

The invention is directed to a through-hole layout structure suitable for a circuit board and used to reduce external interference generated when a signal is transmitted.

The invention is directed to a circuit board used to reduce external interference generated when a signal is transmitted.

The invention is directed to an electronic assembly used to reduce external interference generated when a signal is transmitted.

A through-hole layout structure of the invention is suitable for a circuit board. The through-hole layout structure includes a pair of first differential through-holes, a pair of second differential through-holes, a first ground through-hole, a second ground through-hole, and a third ground through-hole, which are all arranged on a first line. The first ground through-hole is located between the pair of first differential through-holes and the pair of second differential through-holes. The pair of first differential through-holes is located between the first ground through-hole and the second ground through-hole. The pair of second differential through-holes is located between the first ground through-hole and the third ground through-hole.

A circuit board of the invention is suitable for installing an electrical connector. The circuit board includes a plurality of patterned conductive layers, a plurality of dielectric layers alternately stacked with the patterned conductive layers, and the through-hole layout structure.

An electronic assembly of the invention includes the circuit board and an electrical connector installed on the circuit board. The electrical connector includes a pair of first differential pins, a pair of second differential pins, and a first ground pin. The pair of first differential pins is respectively plugged into the pair of first differential through-holes. The pair of second differential pins is respectively plugged into the pair of second differential through-holes. The first ground pin is plugged into the ground through-hole.

Based on the above, in the invention, in the case that one side of each pair of differential through-holes has a ground through-hole, by adding a ground through-hole to the other side of each pair of differential through-holes, each pair of differential through-holes can electrically reference the two ground through-holes of the two terminals thereof. Therefore, the added ground through-hole facilitates the maintenance of the symmetry of a differential transmission path so as to reduce common mode noise converted by each pair of differential through-holes.

In order to make the aforementioned features and advantages of the disclosure more comprehensible, embodiments accompanied with figures are described in detail below.

DETAIL DESCRIPTION OF THE PREFERRED EMBODIMENTS

Figure 1A:
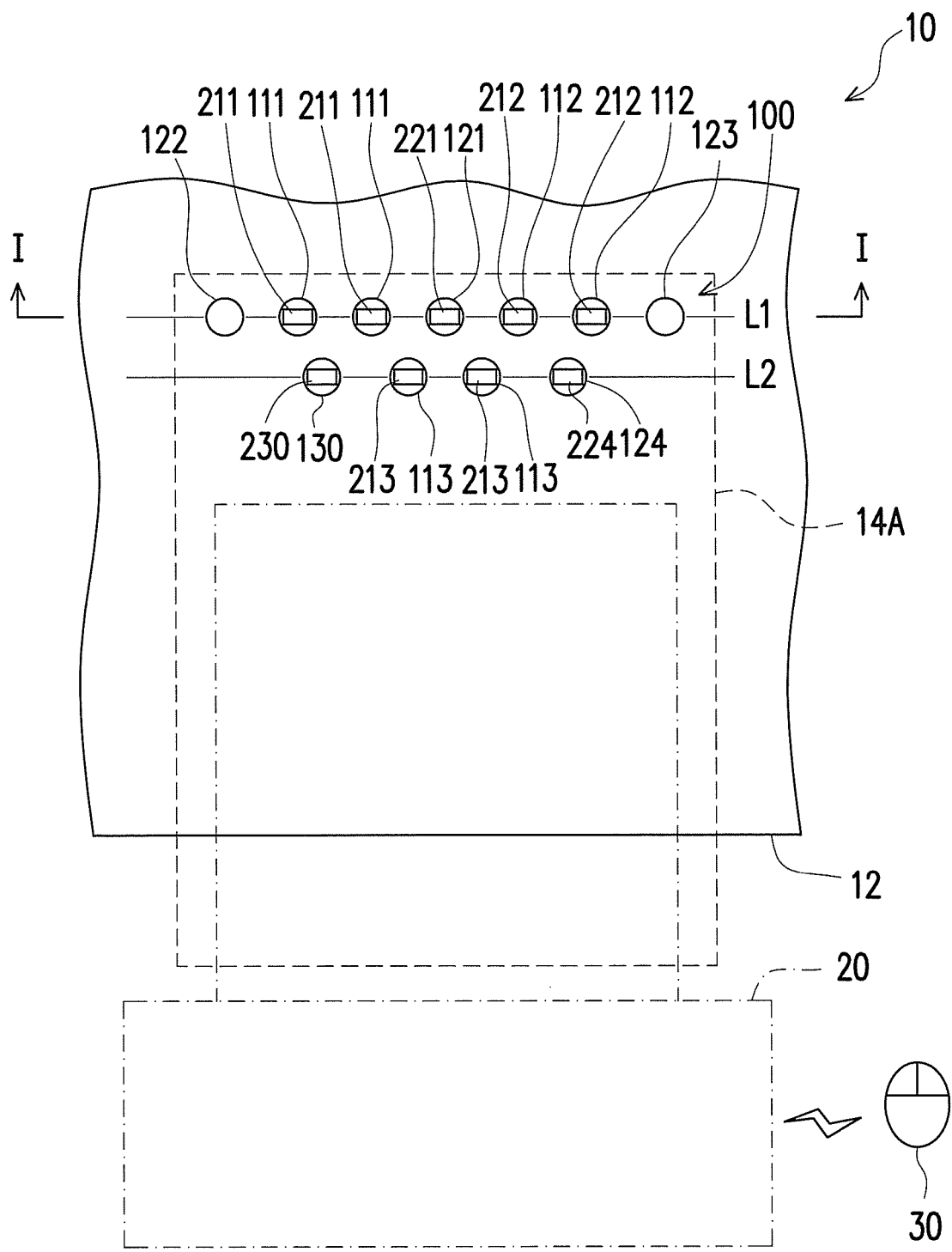
FIG. 1A is a schematic of an electronic assembly of an embodiment of the invention.
Figure 1B:
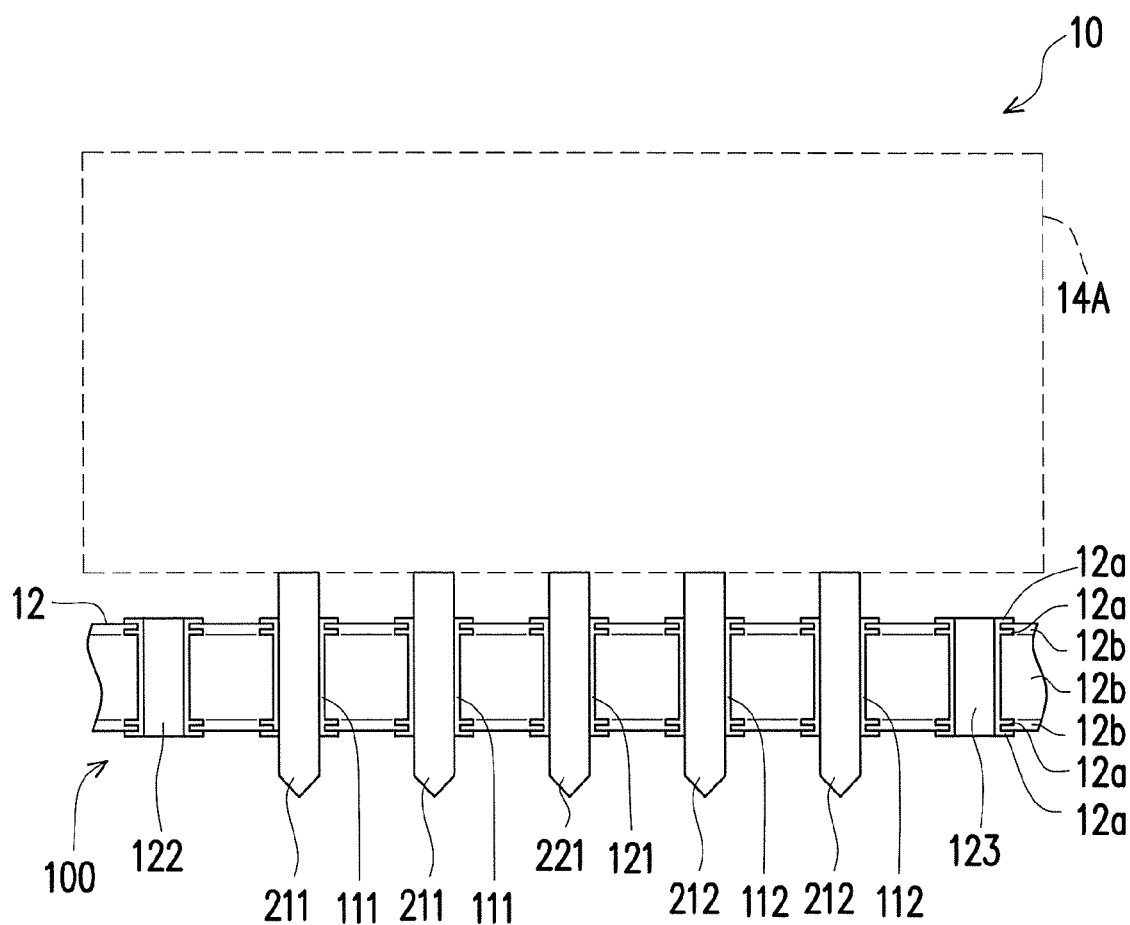
FIG. 1B is a cross-sectional schematic of a portion of the electronic assembly of FIG. 1A along line I-I.

The same reference numerals are used throughout the drawing figures to denote same or like parts, and its designation thereof may not necessarily be repeated in the following detail description. Referring to FIG. 1A and FIG. 1B, in the present embodiment, an electronic assembly 10 includes a circuit board 12 and an electrical connector 14A installed on the circuit board 12. A Universal Serial Bus 3.0 (USB 3.0) or Universal Serial Bus 3.1 (USB 3.1) chip (not shown) can further be installed on the circuit board 12, and the USB 3.0 or USB 3.1 chip is electrically connected to the electrical connector 14A via the circuit board 12. The circuit board 12 includes a plurality of patterned conductive layers 12a and a plurality of dielectric layers 12b, and the patterned conductive layers 12a and the dielectric layers 12b are alternately stacked, as shown in FIG. 1B. To install the electrical connector 14A on the circuit board 12, the circuit board 12 includes a plurality of through-holes, and a plurality of pins of the electrical connector 14A are respectively plugged into the through-holes.

In the present embodiment, the electrical connector 14A is a standard A-type receptacle connector of USB 3.0 or USB 3.1. Therefore, the electrical connector 14A includes a pair of first differential pins 211, a pair of second differential pins 212, and a first ground pin 221. Correspondingly, the circuit board 12 includes a through-hole layout structure 100 including a pair of first differential through-holes 111, a pair of second differential through-holes 112, and a first ground through-hole 121. The pair of first differential pins 211 is respectively plugged into the pair of first differential through-holes 111. The pair of second differential pins 212 is respectively plugged into the pair of second differential through-holes 112. The first ground pin 221 is plugged into the first ground through-hole 121.

According to the arrangement of the pins of the electrical connector 14A, the pair of first differential through-holes 111, the pair of second differential through-holes 112, and the first ground through-hole 121 are arranged on a first line L1 (FIG. 1A). The first ground through-hole 121 is located between the pair of first differential through-holes 111 and the pair of second differential through-holes 112. Moreover, the pair of first differential through-holes 111 transmits a pair of differential signals Tx+ and Tx− on an USB 3.0 or on an USB 3.1, and the pair of second differential through-holes 112 transmits a pair of differential signals Rx+ and Rx− on an USB 3.0 or on an USB 3.1.

To ensure the symmetry of a differential transmission path, the through-hole layout structure 100 further includes a second ground through-hole 122 and a third ground through-hole 123. The second ground through-hole 122 and the third ground through-hole 123 are also arranged on the first line L1. The pair of first differential through-holes 111 is located between the first ground through-hole 121 and the second ground through-hole 122. The pair of second differential through-holes 112 is located between the first ground through-hole 121 and the third ground through-hole 123. Therefore, in addition to electrically referencing the first ground through-hole 121, the pair of first differential through-holes 111 further electrically references the second ground through-hole 122. Similarly, in addition to electrically referencing the first ground through-hole 121, the pair of second differential through-holes 112 further electrically references the third ground through-hole 123. Therefore, the second ground through-hole 122 and the third ground through-hole 123 facilitate the maintenance of the symmetry of a differential transmission path, and do not provide plugging of any pin of the electrical connector 14A. The additional disposition of the second ground through-hole 122 and the third ground through-hole 123 is different from the current art, in which only the first ground through-hole 121 used as a single electrical reference is disposed.

Moreover, since the standard A-type receptacle connector of USB 3.0 or USB 3.1 is compatible with the signal transmission on an Universal Serial Bus 1.0 (USB 1.0) or on an Universal Serial Bus 2.0 (USB 2.0), the electrical connector 14A further includes a pair of third differential pins 213, a power pin 230, and a second ground pin 224 as shown in FIG. 1A. Correspondingly, the through-hole layout structure 100 of the circuit board 12 further includes a pair of third differential through-holes 113, a power through-hole 130, and a fourth ground through-hole 124 as shown in FIG. 1A. The pair of third differential pins 213 is respectively plugged into the pair of third differential through-holes 113. The power pin 230 is plugged into the power through-hole 130. The second ground pin 224 is plugged into the fourth ground through-hole 124.

According to the pin arrangement of the electrical connector 14A, the pair of third differential through-holes 113 is arranged on a second line L2 substantially parallel to the first line L1 (FIG. 1A). The power through-hole 130 is arranged on the second line L2. The fourth ground through-hole 124 is arranged on the second line L2. The pair of third differential through-holes 113 is arranged between the power through-hole 130 and the fourth ground through-hole 124. Moreover, the pair of third differential through-holes 113 transmits a pair of transmission/reception differential signals D+ and D− on an USB 1.0 or on an USB 2.0.

In general, the transmission/reception differential signal terminals (D+ and D−) are in a half-duplex transmission mode, that is, only one of transmission or reception of a signal can be performed. That is, when data transmission is performed, data reception cannot be performed; and when data reception is performed, data transmission cannot be performed. Moreover, in the architecture of USB 3.0 or USB 3.1, the transmission differential signal terminals (Tx+ and Tx−) and the reception differential signal terminals (Rx+ and Rx−) are in a full-duplex transmission mode, that is, transmission or reception of a signal can be directly performed.

Further referring to FIG. 1A, in the present embodiment, a wireless module 20 corresponding to a wireless mouse 30 can be plugged into the electrical connector 14A. Signal is transmitted in a wireless manner between the wireless module 20 and the wireless mouse 30. Therefore, when the clock frequency (2.5 GHz) of a signal transmitted by the pair of first differential through-holes 111 and the pair of second differential through-holes 112 of FIG. 1A is substantially equal to or close to the operating frequency (2.4 GHz) of the wireless module 20, the pair of first differential through-holes 111 can electrically reference the first ground through-hole 121 and the second ground through-hole 122, and the pair of second differential through-holes 112 can electrically reference the first ground through-hole 121 and the third ground through-hole 123. Therefore, the second ground through-hole 122 and the third ground through-hole 123 facilitate the maintenance of the symmetry of a differential transmission path so as to reduce common mode noise converted by the pair of first differential through-holes 111 and the pair of second differential through-holes 112. As a result, RFI to the wireless module 20 is reduced, such that the wireless mouse 30 can perform normal operation.

Figure 2A:
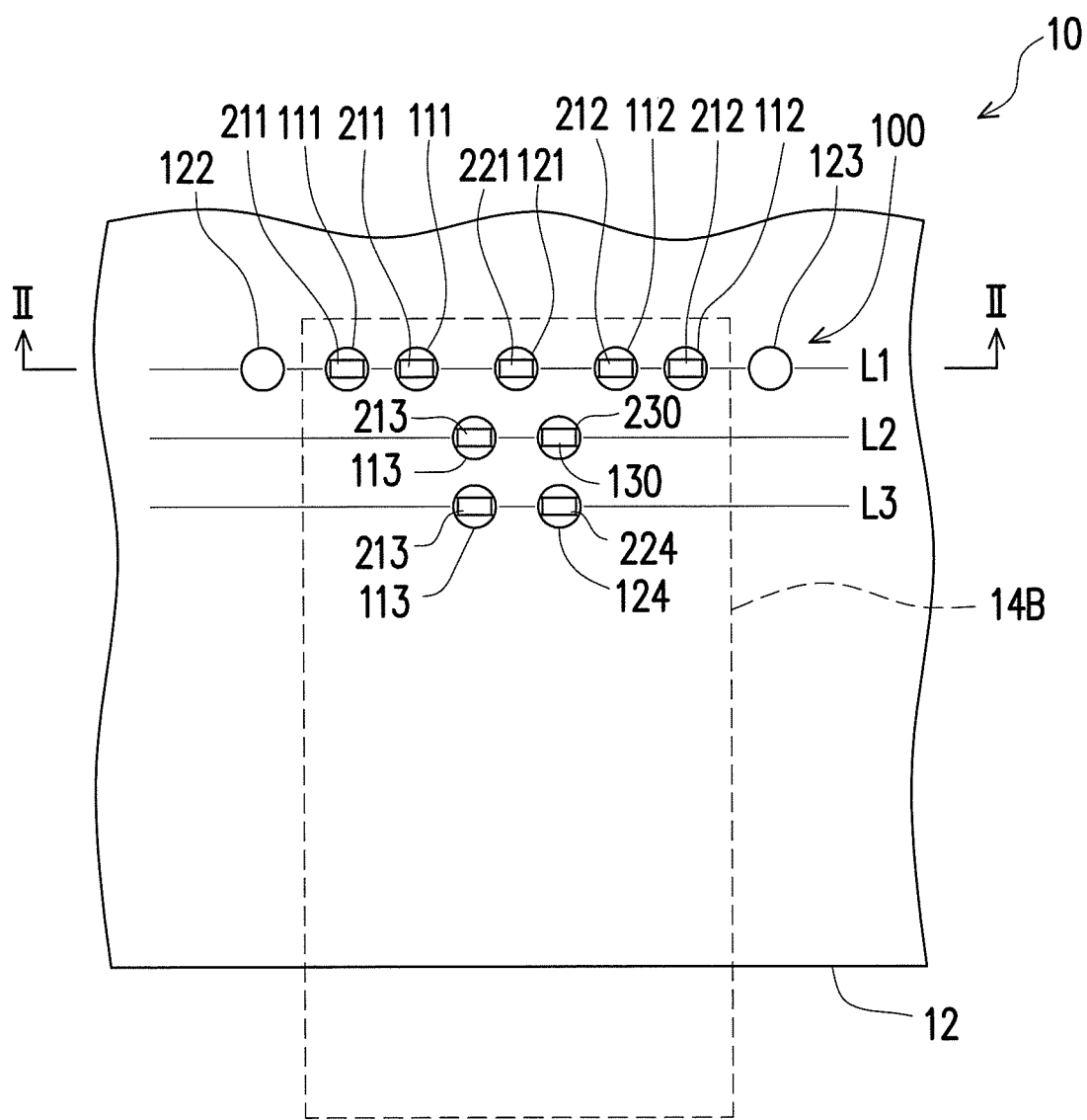
FIG. 2A is a schematic of an electronic assembly of another embodiment of the invention.
Figure 2B:
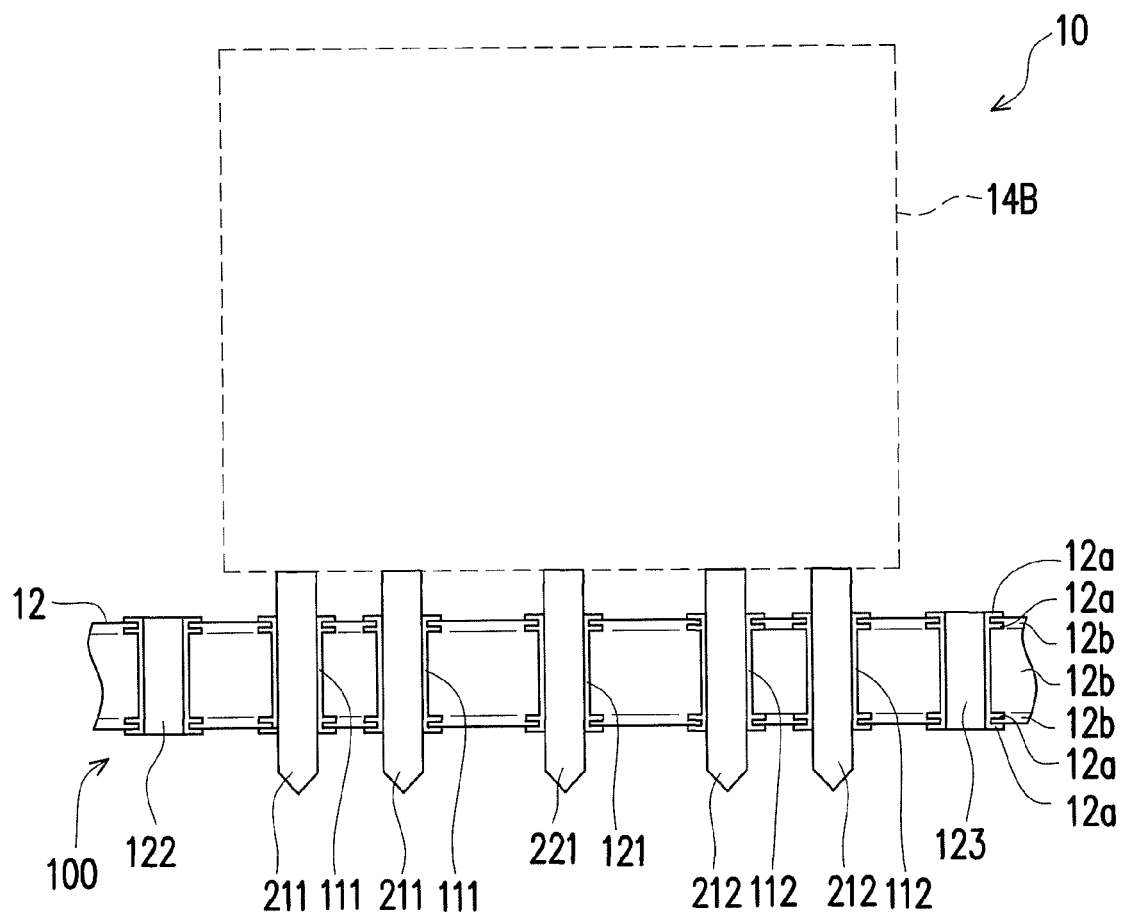
FIG. 2B is a cross-sectional schematic of a portion of the electronic assembly of FIG. 2A along line II-II.

Referring to FIG. 2A and FIG. 2B, the electronic assembly 10 of FIG. 2A and FIG. 2B is similar to the electronic assembly 10 of FIG. 1A and FIG. 1B. The differences between the two are as described below. First, the electrical connector 14A of FIG. 1A and FIG. 1B is a standard A-type receptacle connector of USB 3.0 or USB 3.1, and an electrical connector 14B of FIG. 2A and FIG. 2B is a standard B-type receptacle connector of USB 3.0 or USB 3.1. Therefore, in FIG. 1A and FIG. 1B, the second ground through-hole 122 and the third ground through-hole 123 are overlapped on an orthographic projection of the electrical connector 14A on the circuit board 12. However, in FIG. 2A and FIG. 2B, the second ground through-hole 122 and the third ground through-hole 123 are not overlapped on an orthographic projection of the electrical connector 14B on the circuit board 12. It should be mentioned that, the second ground through-hole 122 and the third ground through-hole 123 facilitate the maintenance of the symmetry of a differential transmission path, and do not provide plugging of any pin of the electrical connector 14A. The additional disposition of the second ground through-hole 122 and the third ground through-hole 123 is different from the current art, in which only the first ground through-hole 121 used as a single electrical reference is disposed.

Moreover, as shown in FIG. 2A, according to the pin arrangement of the electrical connector 14B (that is, standard B-type receptacle connector of USB 3.0 or USB 3.1), the power through-hole 130 and one of the pair of third differential through-holes 113 are arranged on a second line L2 substantially parallel to the first line L1. The fourth ground through-hole 124 and the other one of the pair of third differential through-holes 113 are arranged on a third line L3 substantially parallel to the first line L1.

Based on the above, in the invention, in the case that one side of each pair of differential through-holes has a ground through-hole, by adding a ground through-hole to the other side of each pair of differential through-holes, each pair of differential through-holes can electrically reference the two ground through-holes of the two terminals thereof. Therefore, the added ground through-hole facilitates the maintenance of the symmetry of a differential transmission path so as to reduce common mode noise converted by each pair of differential through-holes. In terms of adopting USB 3.0 (clock frequency at 2.5 GHz) as a transmission protocol apparatus (such as a hub) and an apparatus for which the current operating frequency is at 2.5 GHz, the invention can reduce external interference generated by the apparatus itself so as to reduce RFI to a wireless apparatus (such as the wireless module of a wireless mouse) at an operating frequency of 2.4 GHz (close to 2.5 GHz).

Although the invention has been described with reference to the above embodiments, it will be apparent to one of the ordinary skill in the art that modifications to the described embodiments may be made without departing from the spirit of the invention. Accordingly, the scope of the invention is defined by the attached claims not by the above detailed descriptions.

What is claimed is:

1. A through-hole layout structure, suitable for a circuit board, the through-hole layout structure comprising:
   a pair of first differential through-holes arranged on a first line;
   a pair of second differential through-holes arranged on the first line;
   a first ground through-hole arranged on the first line, wherein the first ground through-hole is located between the pair of first differential through-holes and the pair of second differential through-holes;
   a second ground through-hole arranged on the first line, wherein the pair of first differential through-holes is located between the first ground through-hole and the second ground through-hole; and
   a third ground through-hole arranged on the first line, wherein the pair of second differential through-holes is located between the first ground through-hole and the third ground through-hole.

2. The through-hole layout structure of claim 1, wherein the pair of first differential through-holes electrically references the first ground through-hole and the second ground through-hole, the pair of second differential through-holes electrically references the first ground through-hole and the third ground through-hole, and the second ground through-hole and the third ground through-hole do not provide plugging of a pin of an electrical connector.

3. The through-hole layout structure of claim 1, further comprising:
   a pair of third differential through-holes arranged on a second line substantially parallel to the first line;
   a power through-hole arranged on the second line; and
   a fourth ground through-hole arranged on the second line, wherein the pair of third differential through-holes is located between the power through-hole and the fourth ground through-hole.

4. The through-hole layout structure of claim 3, wherein the pair of first differential through-holes transmits a pair of transmission differential signals Tx+ and Tx− on a first USB 3.0 or on a first USB 3.1, the pair of second differential through-holes transmits a pair of transmission differential signals Rx+ and Rx− on a second USB 3.0 or on a second USB 3.1, and the pair of third differential through-holes transmits a pair of transmission/reception differential signals D+ and D− on an USB 1.0 or on an USB 2.0.

5. The through-hole layout structure of claim 1, further comprising:
   a pair of third differential through-holes;
   a power through-hole arranged on a second line substantially parallel to the first line with one of the pair of third differential through-holes arranged on the second line; and
   a fourth ground through-hole arranged on a third line substantially parallel to the first line with the other one of the pair of third differential through-holes arranged on the third line.

6. The through-hole layout structure of claim 5, wherein the pair of first differential through-holes transmits a pair of transmission differential signals Tx+ and Tx− on a first USB 3.0 or on a first USB 3.1, the pair of second differential through-holes transmits a pair of transmission differential signals Rx+ and Rx− on a second USB 3.0 or on a second USB 3.1, and the pair of third differential through-holes transmits a pair of transmission/reception differential signals D+ and D− on an USB 1.0 or on an USB 2.0.

7. A circuit board, suitable for installing an electrical connector, the circuit board comprising:
   a plurality of patterned conductive layers;
   a plurality of dielectric layers alternately stacked with the plurality of patterned conductive layers; and
   a through-hole layout structure, comprising:
      a pair of first differential through-holes arranged on a first line of the plurality of patterned conductive layers;
      a pair of second differential through-holes arranged on the first line;
      a first ground through-hole arranged on the first line, wherein the first ground through-hole is located between the pair of first differential through-holes and the pair of second differential through-holes;
      a second ground through-hole arranged on the first line, wherein the pair of first differential through-holes is located between the first ground through-hole and the second ground through-hole; and
      a third ground through-hole arranged on the first line, wherein the pair of second differential through-holes is located between the first ground through-hole and the third ground through-hole.

8. The circuit board of claim 7, wherein the pair of first differential through-holes electrically references the first ground through-hole and the second ground through-hole, the pair of second differential through-holes electrically references the first ground through-hole and the third ground through-hole, and the second ground through-hole and the third ground through-hole do not provide plugging of a pin of the electrical connector.

9. The circuit board of claim 7, wherein the through-hole layout structure further comprises:

a pair of third differential through-holes arranged on a second line of the plurality of patterned conductive layers substantially parallel to the first line;

a power through-hole arranged on the second line; and a fourth ground through-hole arranged on the second line, wherein the pair of third differential through-holes is located between the power through-hole and the fourth ground through-hole.

10. The circuit board of claim 9, wherein the pair of first differential through-holes transmits a pair of transmission differential signals Tx+ and Tx− on a first USB 3.0 or on a first USB 3.1, the pair of second differential through-holes transmits a pair of transmission differential signals Rx+ and Rx− on a second USB 3.0 or on a second USB 3.1, and the pair of third differential through-holes transmits a pair of transmission/reception differential signals D+ and D− on an USB 1.0 or on an USB 2.0.

11. The circuit board of claim 7, wherein the through-hole layout structure further comprises:
  a pair of third differential through-holes;
  a power through-hole arranged on a second line of the plurality of patterned conductive layers substantially parallel to the first line and with one of the pair of third differential through-holes arranged on the second line; and
  a fourth ground through-hole arranged on a third line of the plurality of patterned conductive layers substantially parallel to the first line and with the other one of the pair of third differential through-holes arranged on the third line.

12. The circuit board of claim 11, wherein the pair of first differential through-holes transmits a pair of transmission differential signals Tx+ and Tx− on a first USB 3.0 or on a first USB 3.1, the pair of second differential through-holes transmits a pair of transmission differential signals Rx+ and Rx− on a second USB 3.0 or on a second USB 3.1, and the pair of third differential through-holes transmits a pair of transmission/reception differential signals D+ and D− on an USB 1.0 or on an USB 2.0.

13. An electronic assembly, comprising:
  a circuit board, comprising:
    a plurality of patterned conductive layers;
    a plurality of dielectric layers alternately stacked with the plurality of patterned conductive layers; and
    a through-hole layout structure, comprising:
      a pair of first differential through-holes arranged on a first line of the plurality of patterned conductive layers;
      a pair of second differential through-holes arranged on the first line;
      a first ground through-hole arranged on the first line, wherein the first ground through-hole is located between the pair of first differential through-holes and the pair of second differential through-holes;
      a second ground through-hole arranged on the first line, wherein the pair of first differential through-holes is located between the first ground through-hole and the second ground through-hole; and
      a third ground through-hole arranged on the first line, wherein the pair of second differential through-holes is located between the first ground through-hole and the third ground through-hole; and
  an electrical connector installed on the circuit board, the electrical connector comprising:
    a pair of first differential pins respectively plugged into the pair of first differential through-holes;
    a pair of second differential pins respectively plugged into the pair of second differential through-holes; and
    a first ground pin plugged into the first ground through-hole.

14. The electronic assembly of claim 13, wherein the pair of first differential through-holes electrically references the first ground through-hole and the second ground through-hole, the pair of second differential through-holes electrically references the first ground through-hole and the third ground through-hole, and the second ground through-hole and the third ground through-hole do not provide plugging of a pin of the electrical connector.

15. The electronic assembly of claim 13, wherein the through-hole layout structure further comprises:
  a pair of third differential through-holes arranged on a second line of the plurality of patterned conductive layers substantially parallel to the first line;
  a power through-hole arranged on the second line; and
  a fourth ground through-hole arranged on the second line, wherein the pair of third differential through-holes is located between the power through-hole and the fourth ground through-hole, and the electrical connector further comprises:
    a pair of third differential pins respectively plugged into the pair of third differential through-holes;
    a power pin plugged into the power through-hole; and
    a second ground pin plugged into the fourth ground through-hole.

16. The electronic assembly of claim 15, wherein the pair of first differential through-holes transmits a pair of transmission differential signals Tx+ and Tx− on a first USB 3.0 or on a first USB 3.1, the pair of second differential through-holes transmits a pair of transmission differential signals Rx+ and Rx− on a second USB 3.0 or on a second USB 3.1, and the pair of third differential through-holes transmits a pair of transmission/reception differential signals D+ and D− on an USB 1.0 or on an USB 2.0.

17. The electronic assembly of claim 15, wherein the second ground through-hole and the third ground through-hole are overlapped on an orthographic projection of the electrical connector on the circuit board.

18. The electronic assembly of claim 13, wherein the through-hole layout structure further comprises:
  a pair of third differential through-holes;
  a power through-hole arranged on a second line of the plurality of patterned conductive layers substantially parallel to the first line and with one of the pair of third differential through-holes arranged on the second line; and
  a fourth ground through-hole arranged on a third line of the plurality of patterned conductive layers substantially parallel to the first line and with the other one of the pair of third differential through-holes arranged on the third line, and the electrical connector further comprises:
    a pair of third differential pins respectively plugged into the pair of third differential through-holes;
    a power pin plugged into the power through-hole; and
    a second ground pin plugged into the fourth ground through-hole.

19. The electronic assembly of claim 18, wherein the pair of first differential through-holes transmits a pair of transmission differential signals Tx+ and Tx− on a first USB 3.0 or on a first USB 3.1, the pair of second differential through-holes transmits a pair of transmission differential signals Rx+ and Rx− on a second USB 3.0 or on a second USB 3.1, and the pair of third differential through-holes transmits a pair of transmission/reception differential signals D+ and D− on an USB 1.0 or on an USB 2.0.

20. The electronic assembly of claim 18, wherein the second ground through-hole and the third ground through-hole are not overlapped on an orthographic projection of the electrical connector on the circuit board.

21. The electronic assembly of claim 13, wherein the electrical connector is suitable for plugging a wireless module, and an operating frequency of the wireless module is substantially the same as a clock frequency of a signal transmitted by the pair of first differential through-holes or the pair of second differential through-holes.

\* \* \* \* \*